(12) United States Patent
Kang et al.

(10) Patent No.: US 11,476,885 B2
(45) Date of Patent: Oct. 18, 2022

(54) TRANSCEIVER PROCESSING DUOBINARY SIGNAL AND OPERATING METHOD THEREOF

(71) Applicants: SK hynix Inc., Icheon (KR); RESEARCH & BUSINESS FOUNDATION SUNGKYUNKWAN UNIVERSITY, Suwon (KR)

(72) Inventors: Dongsuk Kang, Suwon (KR); Xuefan Jin, Suwon (KR); Jaewoo Park, Incheon (KR); Jung-Hoon Chun, Suwon (KR); Kyu Dong Hwang, Icheon (KR); Dae Han Kwon, Icheon (KR)

(73) Assignees: SK hynix Inc., Icheon (KR); RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 0 days.

(21) Appl. No.: 17/176,897

(22) Filed: Feb. 16, 2021

(65) Prior Publication Data

US 2021/0297107 A1 Sep. 23, 2021

(30) Foreign Application Priority Data

Mar. 17, 2020 (KR) .................. 10-2020-0032524

(51) Int. Cl.
*H04B 1/40* (2015.01)
*H03K 3/037* (2006.01)
(Continued)

(52) U.S. Cl.
CPC ............. *H04B 1/40* (2013.01); *H03K 3/037* (2013.01); *H03K 5/24* (2013.01); *H03K 2005/00078* (2013.01)

(58) Field of Classification Search
CPC ......... G11C 7/02; H03K 3/013; H03K 3/037; H03K 5/24; H03K 5/153; H04B 1/40;
(Continued)

(56) References Cited

U.S. PATENT DOCUMENTS 8,446,942 B2   5/2013   Hasegawa et al.
2014/0140389 A1*  5/2014   Chen .............. H04L 25/03146
                                              375/233
(Continued)

OTHER PUBLICATIONS

Y. Chen et al., "A 36-Gbs 1.3-mWGbs duobinary-signal transmitter exploiting power-efficient cross-quadrature clocking multiplexers with maximized timing margin", IEEE, Sep. 2018, pp. 3014-3026, vol. 65, No. 9, IEEE Trans. Circuits Syst. I Reg. Papers.
(Continued)

*Primary Examiner* — Shawkat M Ali

(57) ABSTRACT

A transceiver includes a duobinary conversion circuit configured to determine a level of an input signal which is a duobinary signal according to an intermediate voltage, a first reference voltage higher than the intermediate voltage, and a second reference voltage lower than the intermediate voltage, and to convert the input signal into a non-return-to-zero (NRZ) signal; and a control circuit configured to generate one or more control signals to substantially remove inter-symbol interference (ISI) between symbols of the input signal, and to adjust the first reference voltage, or the second reference voltage, or both according to the level of the input signal.

20 Claims, 17 Drawing Sheets

(51) Int. Cl.
*H03K 5/24* (2006.01)
*H03K 5/00* (2006.01)

(58) Field of Classification Search
CPC ......... H04L 25/34; H04L 25/49; H04L 27/00;
H04L 27/01
USPC .......... 327/72, 155, 323; 375/219, 233, 295,
375/316, 340
See application file for complete search history.

(56) References Cited

U.S. PATENT DOCUMENTS

2018/0159514 A1  6/2018  Zerbe et al.
2019/0074863 A1  3/2019  Ahn

OTHER PUBLICATIONS

Yu-Ming Ying et al., "A 20Gbs adaptive duobinary transceiver", IEEE Asian Solid-State Circuits Conference (A-SSCC), Nov. 2012, pp. 129-132, Kobe Japan.

* cited by examiner

FIG. 2

| NRZ Signal | | Duobinary Signal |
|---|---|---|
| Previous bit | Current bit | Level |
| 1 | 1 | 2 |
| 1 | 0 | 1 |
| 0 | 1 | 1 |
| 0 | 0 | 0 |

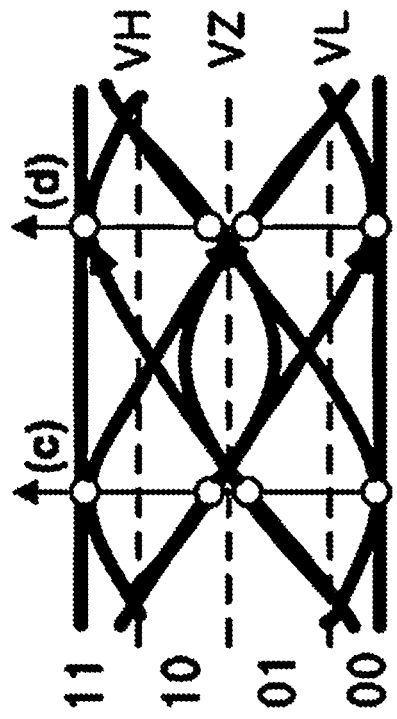
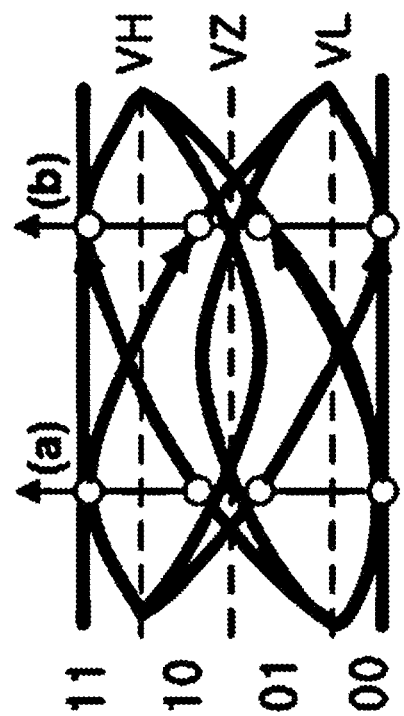
FIG. 11A
FIG. 11B

FIG. 12

| Previous Level (State) \ Current Level (State) | 0 (00) | 1 (01) | 1 (10) | 2 (11) |
|---|---|---|---|---|
| 0 (00) | X | Post Up | Post Down | X |
| 1 (01) | Pre Up | X | X | Pre Down |
| 1 (10) | Pre Down | X | X | Pre Up |
| 2 (11) | X | Post Down | Post Up | X |

TRANSCEIVER PROCESSING DUOBINARY SIGNAL AND OPERATING METHOD THEREOF

CROSS-REFERENCE TO RELATED APPLICATION

The present application claims priority under 35 U.S.C. § 119(a) to Korean Patent Application No. 10-2020-0032524, filed on Mar. 17, 2020, which is incorporated herein by reference in its entirety.

BACKGROUND

1. Technical Field

Various embodiments generally relate to a transceiver processing duobinary signal and an operating method of the transceiver.

2. Related Art

When data is processed at a relatively high speed, a channel positioned between a transmitter and a receiver has a characteristic of a low-pass filter.

When a channel has the characteristics of a low-pass filter, a sudden change in a signal is suppressed as a data transmission rate increases, and it is difficult to accurately detect a signal level when a signal reaches a receiver.

In order to address this issue, technologies (e.g., duobinary coding technology) are being developed for lowering the Nyquist frequency by changing the waveform of data through coding.

Duobinary coding is a technique that converts 2-level data into 3-level data by combining a previous bit and a current bit of 2-level Non-return-to-zero (NRZ) signal.

For example, when the previous bit is 1 and the current bit is 1, it corresponds to level 2 of the duobinary signal, and when the previous bit is 1 and the current bit is 0 or when the previous bit is 0 and the current bit is 1, it corresponds to level 1 of the duobinary signal, and when the previous bit is 0 and the current bit is 0, it corresponds to level 0 of the duobinary signal.

A receiver that receives a duobinary signal performs converting a duobinary signal received through a channel into an NRZ signal.

SUMMARY

In accordance with an embodiment of the present disclosure, a transceiver may include a duobinary conversion circuit configured to determine a level of an input signal which is a duobinary signal according to an intermediate voltage, a first reference voltage higher than the intermediate voltage, and a second reference voltage lower than the intermediate voltage, and to convert the input signal into a non-return-to-zero (NRZ) signal; and a control circuit configured to generate one or more control signals to substantially remove inter-symbol interference (ISI) between symbols of the input signal, and to adjust the first reference voltage, or the second reference voltage, or both according to the level of the input signal.

In accordance with an embodiment of the present disclosure, an operating method of a transceiver including a duobinary conversion circuit configured to determine a level of an input signal which is a duobinary signal according to an intermediate voltage, a first reference voltage higher than the intermediate voltage, and a second reference voltage lower than the intermediate voltage, and to convert the input signal into a non-return-to-zero (NRZ) signal, the method may include generating one or more control signals to substantially remove inter-symbol interference (ISI) in the input signal according to the level of the input signal; and adjusting the first reference voltage, or the second reference voltage, or both.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIG. 2 illustrates a relation between an NRZ signal and a duobinary signal.

FIGS. 11A and 11B are eye diagrams illustrating strength of an equalization operation.

FIG. 12 illustrates an equalization operation according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
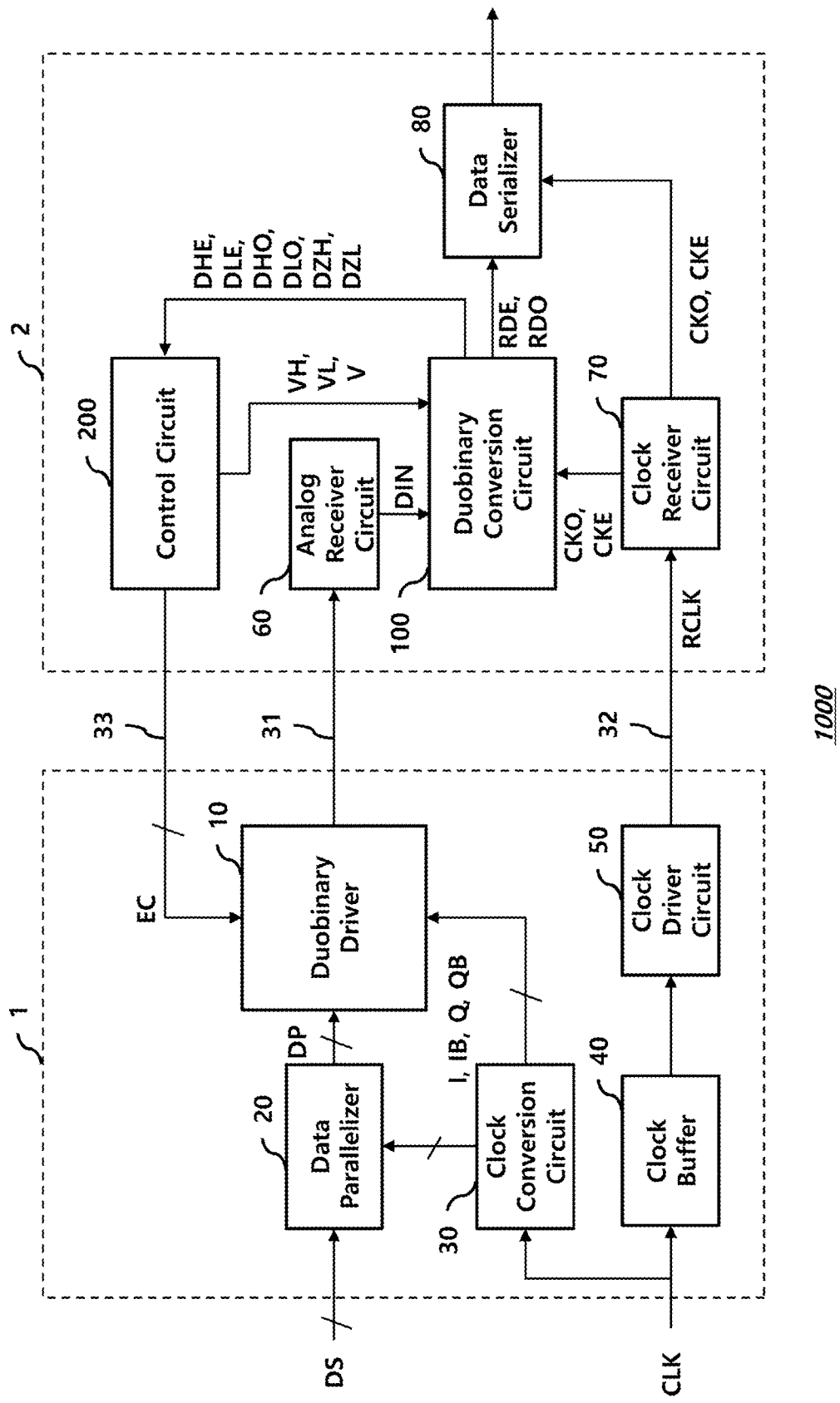
FIG. 1 illustrates a transceiver for transmitting and receiving a duobinary signal according to an embodiment of the present disclosure.

FIG. 1 is a block diagram illustrating a transceiver 1000 for transmitting and receiving a duobinary signal according to an embodiment of the present disclosure.

The transceiver 1000 includes a transmitter 1 and a receiver 2.

The transmitter 1 includes a duobinary driver 10, a data parallelizer 20, a clock conversion circuit 30, a clock buffer 40, and a clock driver circuit 50.

The duobinary driver 10 drives a data channel 31 by converting binary parallel data DP output from the data parallelizer 20 into a duobinary signal.

In this case, the duobinary driver 10 may perform an equalization operation according to one or more control signals EC.

The control signals EC may include a pre-control signal and a post-control signal, and may further include a main-control signal. This will be described in detail below.

The configuration and operation of the duobinary driver 10 will be described in detail below.

The data parallelizer 20 converts serial data DS into parallel data DP. At this time, each bit of the parallel data DP is a binary signal in the form of Non-return-to-zero (NRZ) format, respectively.

The clock conversion circuit 30 generates four-phase clock signals I, Q, IB, and QB from the clock signal CLK.

The data parallelizer 20 outputs parallel data (or parallel data signals) DP0, DP90, DP180, and DP270 synchronized with the four-phase clock signals I, Q, IB, and QB.

Figure 5:
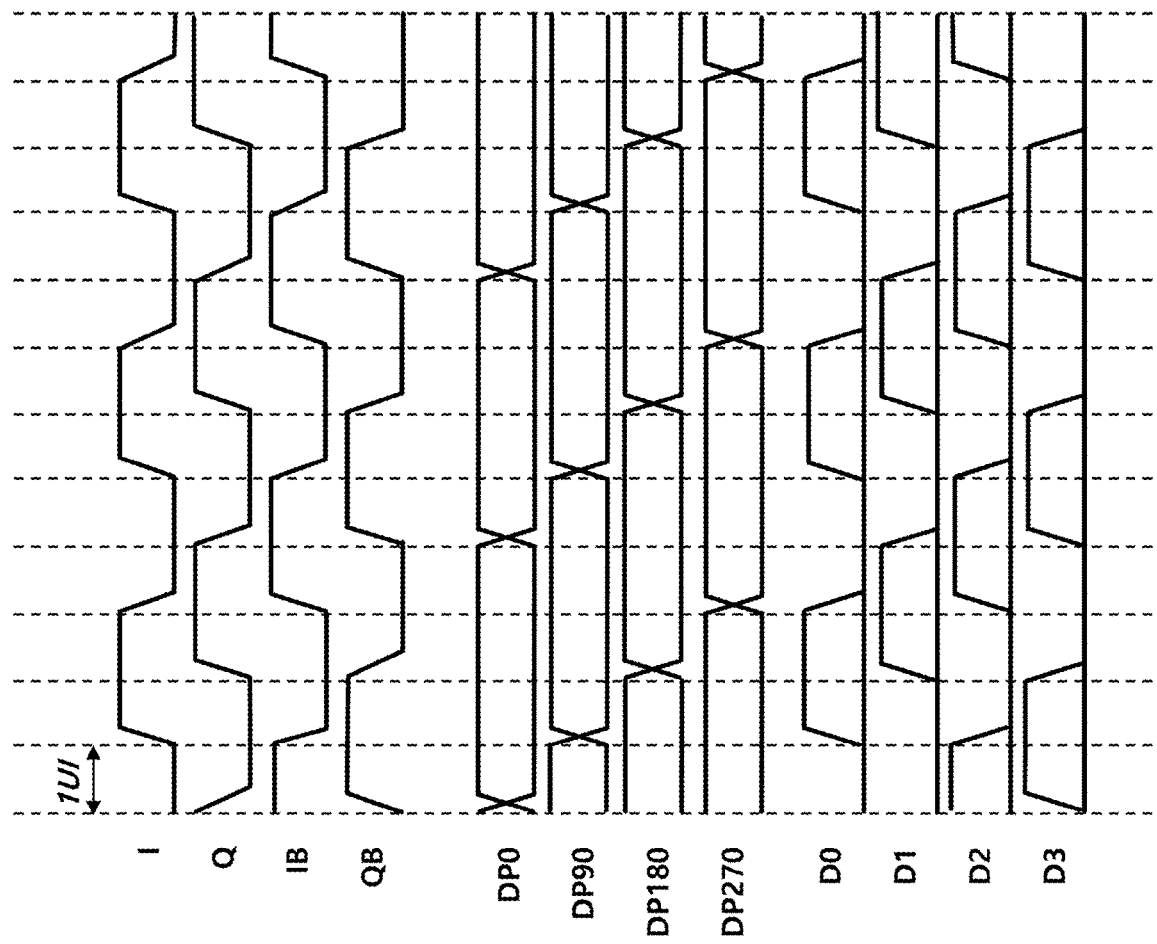
FIG. 5 illustrates an operation of a pre-driver according to an embodiment of the present disclosure.

Parallel data DP0, DP90, DP180, and DP270 synchronized with the four-phase clock signals I, Q, IB, and QB are shown in the timing diagram of FIG. 5.

In the following, a clock signal corresponding to the first phase of the four-phase clock signals is referred to as a first clock signal I, a clock signal corresponding to second phase among the four-phase clock signals is referred to as a second clock signal Q, a clock signal corresponding to third phase among the four-phase clock signals is referred to as a third clock signal IB, and a clock signal corresponding to fourth phase among the four-phase clock signals is referred to as a fourth clock signal QB.

As shown in FIG. 5, parallel data (or a first parallel data signal) DP0 is synchronized with the fourth clock signal QB, parallel data DP90 is synchronized with the first clock signal I, and parallel data DP180 is synchronized with the second clock signal Q, and the parallel data DP270 is synchronized with the third clock signal IB.

Hereinafter, a signal synchronized with the fourth clock signal QB among parallel data DP is referred to as first parallel data (or a first parallel data signal) DP0, and a signal synchronized with the first clock signal I among parallel data DP is referred to as second parallel data (or a second parallel data signal) DP90, a signal synchronized with the second clock signal Q is referred to as third parallel data (or a third parallel data signal) DP180, and a signal synchronized with the third clock signal IB among parallel data DP is referred to as fourth parallel data (or a fourth parallel data signal) DP270.

The clock buffer 40 buffers the clock signal CLK and provides the buffered clock signal to the clock driver 50, and the clock driver 50 drives the clock channel 32 according to the clock signal CLK output from the clock buffer 40.

FIG. 2 is a table illustrating a relationship between an NRZ signal and a duobinary signal.

When a previous bit is 1 and a current bit is 1 in an NRZ signal, the NRZ signal corresponds to a duobinary signal having a first level (e.g., level 2).

When a previous bit is 1 and a current bit is 0 in an NRZ signal, the NRZ signal corresponds to a duobinary signal having a second level (e.g., level 1).

When a previous bit is 0 and a current bit is 1 in an NRZ signal, the NRZ signal corresponds to a duobinary signal having the second level (e.g., level 1).

When a previous bit is 0 and a current bit is 0 in an NRZ signal, the NRZ signal corresponds to a duobinary signal having a third level (e.g., level 0).

Figure 3:
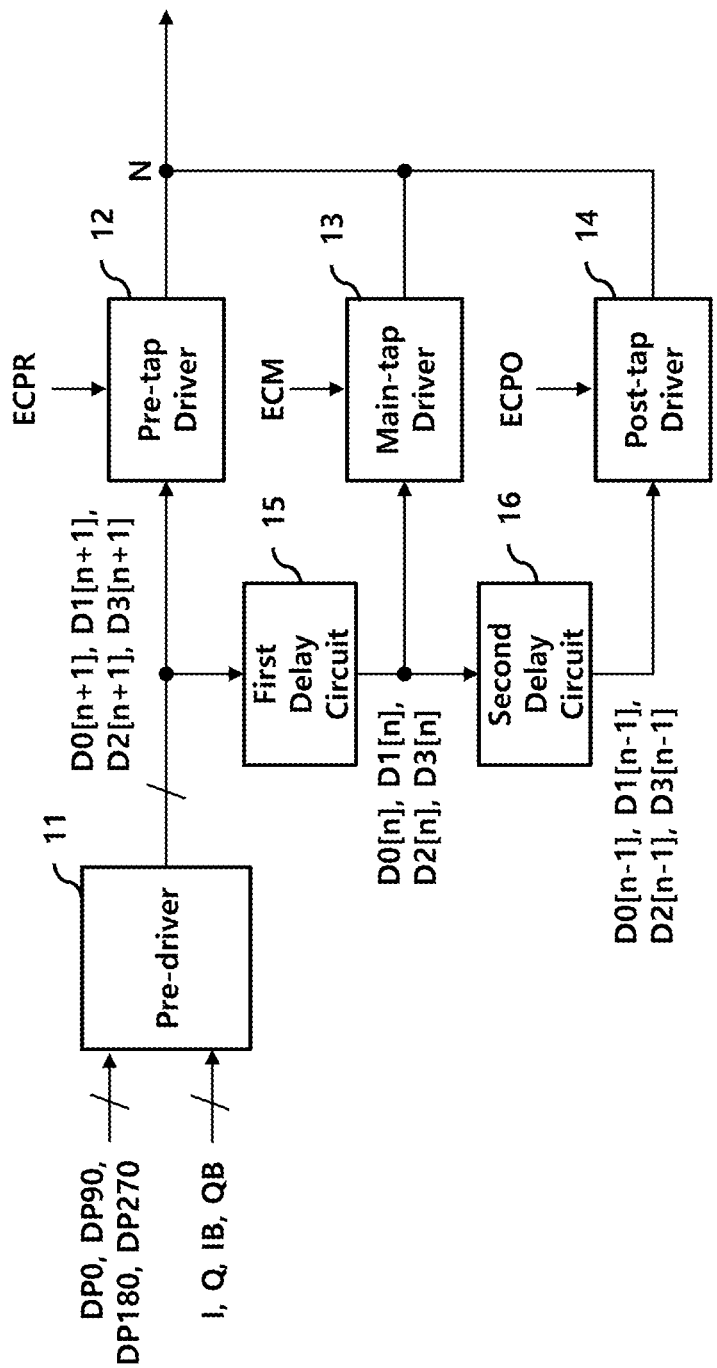
FIG. 3 illustrates a duobinary driver according to an embodiment of the present disclosure.

FIG. 3 is a block diagram showing the duobinary driver 10 in FIG. 1 according to an embodiment of the present disclosure.

The duobinary driver 10 includes a pre-driver 11, a pre-tap driver 12, a main-tap driver 13, and a post-tap driver 14.

The duobinary driver 10 includes a first delay circuit 15 and a second delay circuit 16 for sequentially delaying a signal output from the pre-driver 11.

The pre-driver 11 outputs operation data D0, D1, D2, and D3 by operating four-phase clock signals I, Q, IB, and QB and parallel data DP0, DP90, DP180, and DP270.

Figure 4:
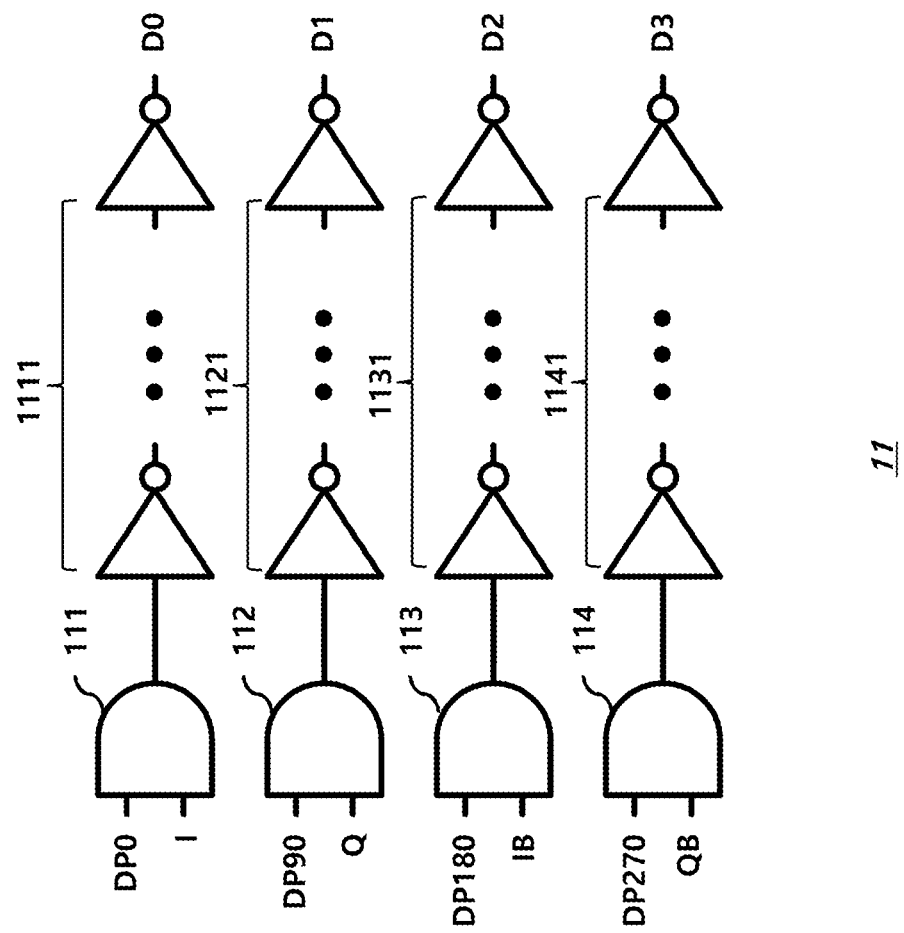
FIG. 4 illustrates a pre-driver according to an embodiment of the present disclosure.

FIG. 4 is a circuit diagram of the pre-driver 11 in FIG. 3 according to an embodiment of the present disclosure.

The pre-driver 11 includes a first gate (e.g., a first logic gate) 111 and a first buffer 1111.

The first gate 111 performs an AND operation on the first parallel data DP0 and the first clock signal I.

The first buffer 1111 includes an even number of inverters connected in series and buffers an output of the first gate 111 to output a first operation data D0. Hereinafter, the first operation data D0 may be referred to as first data (or a first data signal).

The pre-driver 11 includes a second gate 112 and a second buffer 1121.

The second gate 112 performs an AND operation on the second parallel data DP90 and the second clock signal Q.

The second buffer 1121 includes an even number of inverters connected in series and buffers an output of the second gate 112 to output second operation data D1. Hereinafter, the second operation data D1 may be referred to as second data (or a second data signal).

The pre-driver 11 includes a third gate 113 and a third buffer 1131.

The third gate 113 performs an AND operation on the third parallel data DP180 and the third clock signal IB.

The third buffer 1131 includes an even number of inverters connected in series and buffers an output of the third gate 113 to output third operation data D2. Hereinafter, the third operation data D2 may be referred to as third data (or a third data signal).

The pre-driver 11 includes a fourth gate 114 and a third buffer 1141.

The fourth gate 114 performs an AND operation on the fourth parallel data DP270 and the fourth clock signal QB.

The fourth buffer 1141 includes an even number of inverters connected in series and buffers an output of the fourth gate 114 to output fourth operation data D3. Hereinafter, the fourth operation data D3 may be referred to as fourth data (or a fourth data signal).

FIG. 5 is a timing diagram showing an operation of the pre-driver 11 in FIG. 4 according to an embodiment.

The first data D0 is substantially the same as the first parallel data DP0 when the first clock signal I is at a high level, and has a low level when the first clock signal I is at a low level.

The second data D1 is substantially the same as the second parallel data DP90 when the second clock signal Q is at the high level, and has the low level when the second clock signal Q is at the low level.

The third data D2 is substantially the same as the third parallel data DP180 when the third clock signal IB is at the high level, and has the low level when the third clock signal IB is at the low level.

The fourth data D3 is substantially the same as the fourth parallel data DP270 when the fourth clock signal QB is at the high level, and has the low level when the fourth clock signal QB is at the low level.

Returning to FIG. 3, the first delay circuit 15 delays the first to fourth data output from the pre-driver 11 by a predetermined time to generate first delayed operation data, and the second delay circuit 16 delays data output from the first delay circuit 15 by a predetermined time to generate second delayed operation data.

The first to fourth data output from the first delay circuit 15 correspond to current or present values $D0[n]$, $D1[n]$, $D2[n]$, and $D3[n]$ of the first to fourth data, respectively.

In addition, the first to fourth data output from the second delay circuit 16 correspond to past values $D0[n-1]$, $D1[n-1]$, $D2[n-1]$, and $D3[n-1]$ of the first to fourth data, respectively.

In addition, the first to fourth data input to the first delay circuit 15 correspond to future values $D0[n+1]$, $D1[n+1]$, $D2[n+1]$, and $D3[n+1]$ of the first to fourth data, respectively.

Figure 6:
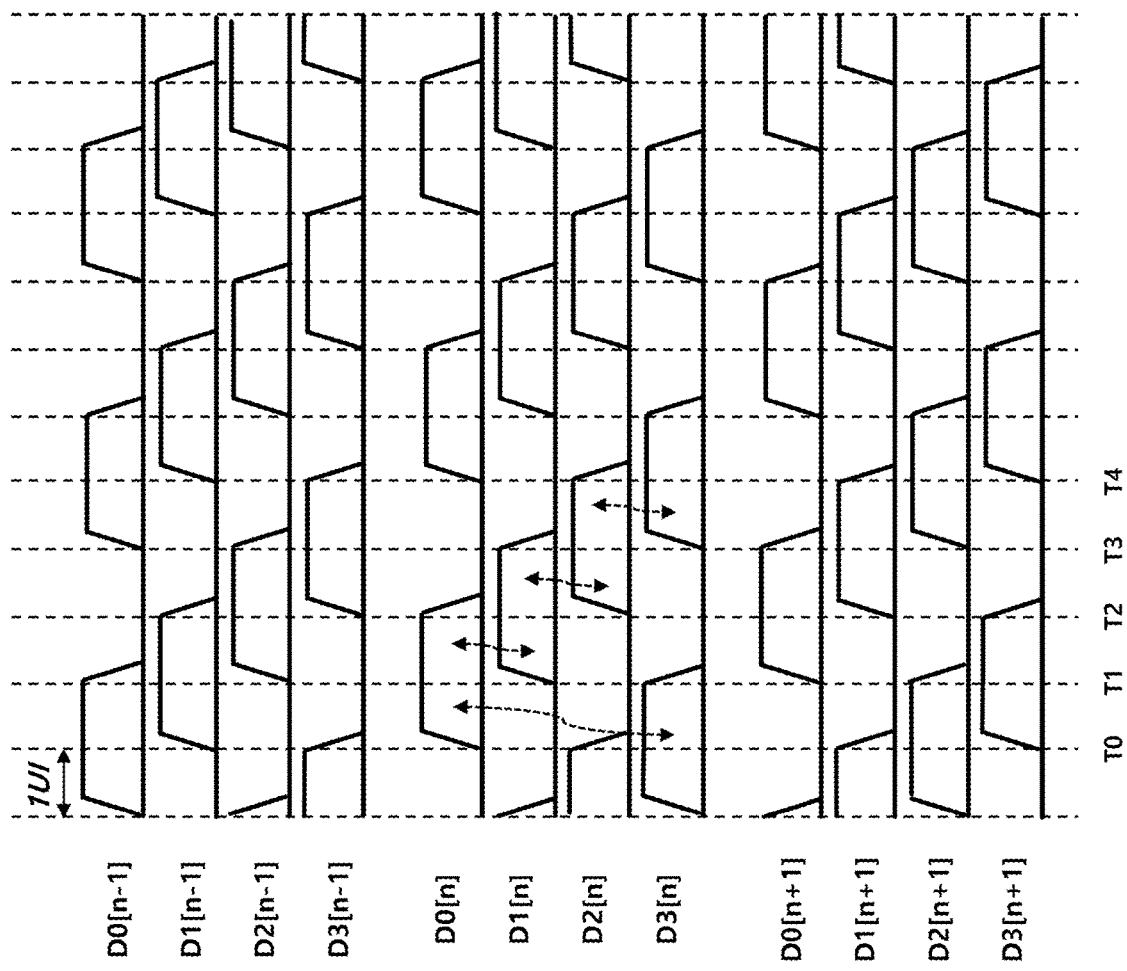
FIG. 6 is a timing diagram illustrating data output from a pre-driver according to an embodiment of the present disclosure.

FIG. 6 shows a relationship between the future values $D0[n+1]$, $D1[n+1]$, $D2[n+1]$, and $D3[n+1]$, the present values $D0[n]$, $D1[n]$, $D2[n]$, and $D3[n]$, and the past values $D0[n-1]$, $D1[n-1]$, $D2[n-1]$, and $D3[n-1]$ of first to fourth data according to an embodiment.

In this embodiment, the first delay circuit 15 and the second delay circuit 16 each have a delay time of 1 unit interval (UI), which corresponds to a phase difference of 90 degrees of the first clock signal I.

The pre-tap driver 12 drives an output node N according to the pre-control signal ECPR and the first to fourth data output from the pre-driver 11.

The main-tap driver 13 drives the output node N according to the main-control signal ECM and the first to fourth data output from the first delay circuit 15.

The post-tap driver 14 drives the output node N according to the post-control signal ECPO and the first to fourth data output from the second delay circuit 16.

In an embodiment, the pre-tap driver 12, the main-tap driver 13, and the post-tap driver 14 have substantially the same structure, but have different driving strengths.

Figure 7:
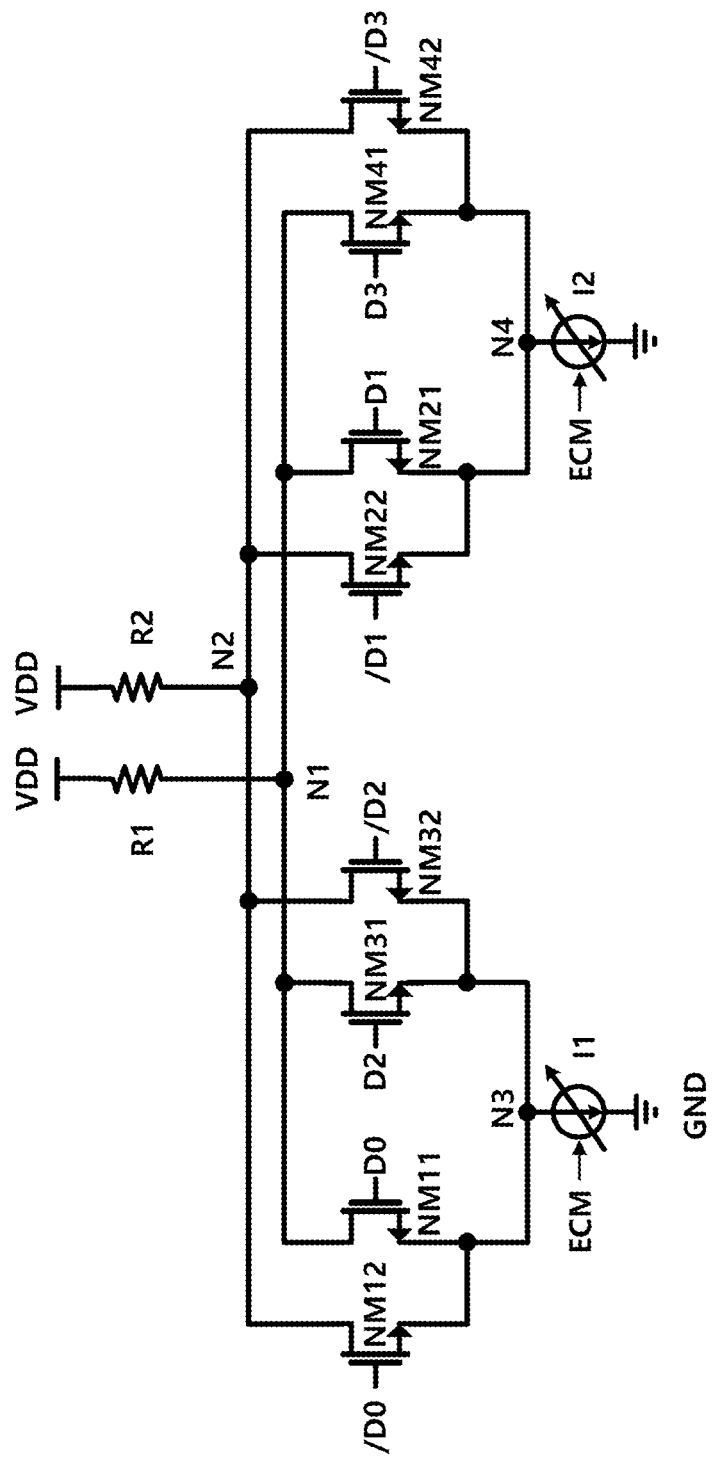
FIG. 7 illustrates a pre-tap driver according to an embodiment of the present disclosure.

FIG. 7 is a circuit diagram showing the structure of the main-tap driver 13 in FIG. 3 according to an embodiment.

The main-tap driver 13 includes a first resistor R1 coupled between a power voltage VDD and a first node N1, and a second resistor R2 coupled between the power voltage VDD and a second node N2.

The first resistor R1 and the second resistor R2 have substantially the same resistance, and the second node N2 is coupled to the output node N of FIG. 3.

The main-tap driver 13 includes an eleventh switch NM11 coupled between the first node N1 and a third node N3, and a twelfth switch NM12 coupled between the second node N2 and the third node N3.

The eleventh switch NM11 is controlled by the first data D0, and a twelfth switch NM12 is controlled by first inverted data/D0 obtained by inverting the first data D0.

The main-tap driver 13 includes a 21st switch NM21 coupled between the first node N1 and a fourth node N4, and a 22nd switch NM22 coupled between the second node N2 and the fourth node N4.

The 21st switch NM21 is controlled by the second data D1, and the 22nd switch NM22 is controlled by second inverted data/D1 obtained by inverting the second data D1.

The main-tap driver 13 includes a 31st switch NM31 coupled between the first node N1 and the third node N3, and a 32nd switch NM32 coupled between the second node N2 and the third node N3.

The 31st switch NM31 is controlled by the third data D2, and the 32nd switch NM32 is controlled by third inverted data/D2 obtained by inverting the third data D2.

The main-tap driver 13 includes a 41st switch NM41 coupled between the first node N1 and the fourth node N4, and a 42nd switch NM42 coupled between the second node N2 and the fourth node N4.

The 41st switch NM41 is controlled by the fourth data D3 and the 42nd switch NM42 is controlled by fourth inverted signal/D3 obtained by inverting the fourth data D3.

The main-tap driver 13 includes a first current source I1 coupled between the third node N3 and a ground voltage GND, and a second current source I2 coupled between the fourth node N4 and the ground voltage GND.

In this embodiment, the amount of current flowing through the first current source I1 and the second current source I2 may be controlled according to the main control signal ECM.

For example, a magnitude of a current of each of the first current source I1 and the second current source I2 may be adjusted according to the main control signal ECM around a default current of 6 mA.

Hereinafter, each of the first current source I1 and the second current source 12 may be referred to as a current source.

An operation of the main-tap driver 13 will be described below with reference to FIG. 6 as follows.

It is assumed that the main-tap driver 13 operates in synchronization with the first clock signal I in FIG. 5.

An interval (or a time interval) between T0 and T4 in FIG. 6 corresponds to an operation period of the main-tap driver 13.

Each of intervals between T0 and T1, between T1 and T2, between T2 and T3, and between T3 and T4 is referred to as a unit interval, and the duration of the unit interval corresponds to 1 UI.

During an interval between T0 and T1, the main-tap driver 13 operates according to the fourth data $D3[n]$ and the first data $D0[n]$, and during an interval between T1 and T2, the main-tap driver 13 operates according to the first data $D0[n]$ and the second data $D1[n]$, during an interval between T2 and T3, the main-tap driver 13 operates according to the second data $D1[n]$ and the third data $D2[n]$, and during an interval between T3 and T4, the main-tap driver 13 operates according to the third data $D2[n]$ and the fourth data $D3[n]$.

During an interval between T0 and T4 of FIG. 6, the pre-tap driver 12 and the post-tap driver 14 in FIG. 3 also operate together.

During an interval between T0 and T1, the post-tap driver 14 operates according to the first data $D0[n-1]$ and the second data $D1[n-1]$, during an interval between T1 and T2, the post-tap driver 14 operates according to the second data $D1[n-1]$ and the third data $D2[n-1]$, during an interval between T2 and T3, the post-tap driver 14 operates according to the third data D2[$n-1$] and the fourth data D3[$n-1$], and during an interval between T3 and T4, the post-tap driver 14 operates according to the fourth data D3[$n-1$] and the first data D0[$n-1$].

During an interval between T0 and T1, the pre-tap driver 12 operates according to the third data D2[$n+1$] and the fourth data D3[$n+1$], during an interval between T1 and T2, the pre-tap driver 12 operates according to the fourth data D3[$n+1$] and the first data D0[$n+1$], during an interval between T2 and T3, the pre-tap driver 12 operates according to the first data D0[$n+1$] and the second data D1[$n+1$], and during an interval between T3 and T4, the pre-tap driver 12 operates according to the second data D1[$n+1$] and the third data D2[$n+1$].

In each unit interval, a selected data signal is applied to one of the 11th switch NM11 and the 31st switch NM31 of the main-tap driver 13, and a selected data signal is applied to one of the 21st switch NM21 and the 41st switch NM41 of the main-tap driver 13.

At this time, unselected data is fixed at the low level.

Hereinafter, when the first data D0 and the second data D1 are selected and applied to the 11th switch NM11 and the 21st switch NM21, the operation of the main-tap driver 13 is started.

In addition, it is assumed that current provided by each of the first current source I1 and the second current source I2 is denoted by I, and resistance of each of the first resistor R1 and the second resistor R2 is denoted by R.

Assuming that the first data D0 is at a high level and the second data D1 is at a high level, since the 12th switch NM12 and the 22nd switch NM22 are turned off, voltage of the second node N2 coupled to the output node N is expressed as Equation 1 below.

$$V_{N2}=VDD \qquad \text{[Equation 1]}$$

Assuming that the first data D0 is at the high level and the second data D1 is at a low level, the twelfth switch NM12 is turned off and the 22nd switch NM22 is turned on, so the voltage of the second node N2 is represented as Equation 2 below.

Similarly, when the first data D0 is at the low level and the second data D1 is at the high level, the voltage of the second node N2 is represented as Equation 2 below.

$$V_{N2}=VDD-I*R \qquad \text{[Equation 2]}$$

Assuming that the first data D0 is at the low level and the second data D1 is at the low level, since the twelfth switch NM12 and the 22nd switch NM22 are turned on, the voltage of the second node N2 is represented like Equation 3 below.

$$V_{N2}=VDD-2*I*R \qquad \text{[Equation 3]}$$

As described above, the main-tap driver 13 generates a duobinary signal having three levels according to previous data and current data.

The pre-tap driver 12 and the post-tap driver 14 each have substantially the same structure as the main-tap driver 13.

However, a current source included in the pre-tap driver 12 is controlled according to the pre-control signal ECPR, and a current source included in the post-tap driver 14 is controlled according to the post-control signal ECPO.

In an embodiment, a magnitude of a current of the current source included in the pre-tap driver 12 is controlled according to the pre-control signal ECPR around a default current of 0.5 mA, and a magnitude of a current of the current source included in the post-tap driver 14 is controlled according to a post-control signal ECPO around a default current of 1 mA.

The magnitudes of the pre-control signal ECPR and the post-control signal ECPO are controlled by an equalization operation performed by a control circuit (e.g., the control circuit 200 in FIG. 1).

Through the equalization operation, an inter-symbol interference (ISI) of a signal transmitted from the output node N may be substantially eliminated.

The equalization operation will be described in detail below.

Returning to FIG. 1, the receiver 2 includes an analog receiver circuit 60, a duobinary conversion circuit 100, a clock receiver circuit 70, a data serializer 80, and a control circuit 200.

The analog receiver circuit 60 receives and outputs a duobinary signal from the data channel 31.

For example, the analog receiver circuit 60 can be implemented using a continuous time linear equalizer (CTLE).

The clock receiver circuit 70 receives the clock signal RCLK from the clock channel 32 and outputs an odd clock signal CKO and an even clock signal CKE.

The odd clock signal CKO is a signal synchronized with odd-numbered edges of the clock signal RCLK, and the even clock signal CKE is a signal synchronized with even-numbered edges of the clock signal RCLK. Each of the odd clock signal CKO and the even clock signal CKE has a frequency corresponding to a half of a frequency of the clock signal RCLK.

The duobinary conversion circuit 100 decodes an input signal DIN according to a first reference voltage VH, a second reference voltage VL, an odd clock signal CKO, and an even clock signal CKE, and outputs an odd data signal RDO and an even data signal RDE in the form of NRZ.

The data serializer 80 serializes and outputs the odd data signal RDO and the even data signal RDE according to the odd clock signal CKO and the even clock signal CKE.

The control circuit 200 controls an equalization operation to remove inter-symbol interference (ISI) included in the input signal DIN.

The control circuit 200 controls the pre-control signal ECPR and the post-control signal ECPO by using the level of the input signal DIN sampled by the duobinary conversion circuit 100 for the equalization operation and sends the pre-control signal ECPR and the post-control signal ECPO to the transmitter 1 through the control channel 33.

Also, the control circuit 200 controls a first reference voltage VH, or a second reference voltage VL, or both provided to the duobinary circuit 100.

The equalization operation and the reference voltage control operation performed by the control circuit 200 will be described in detail below.

Figure 8:
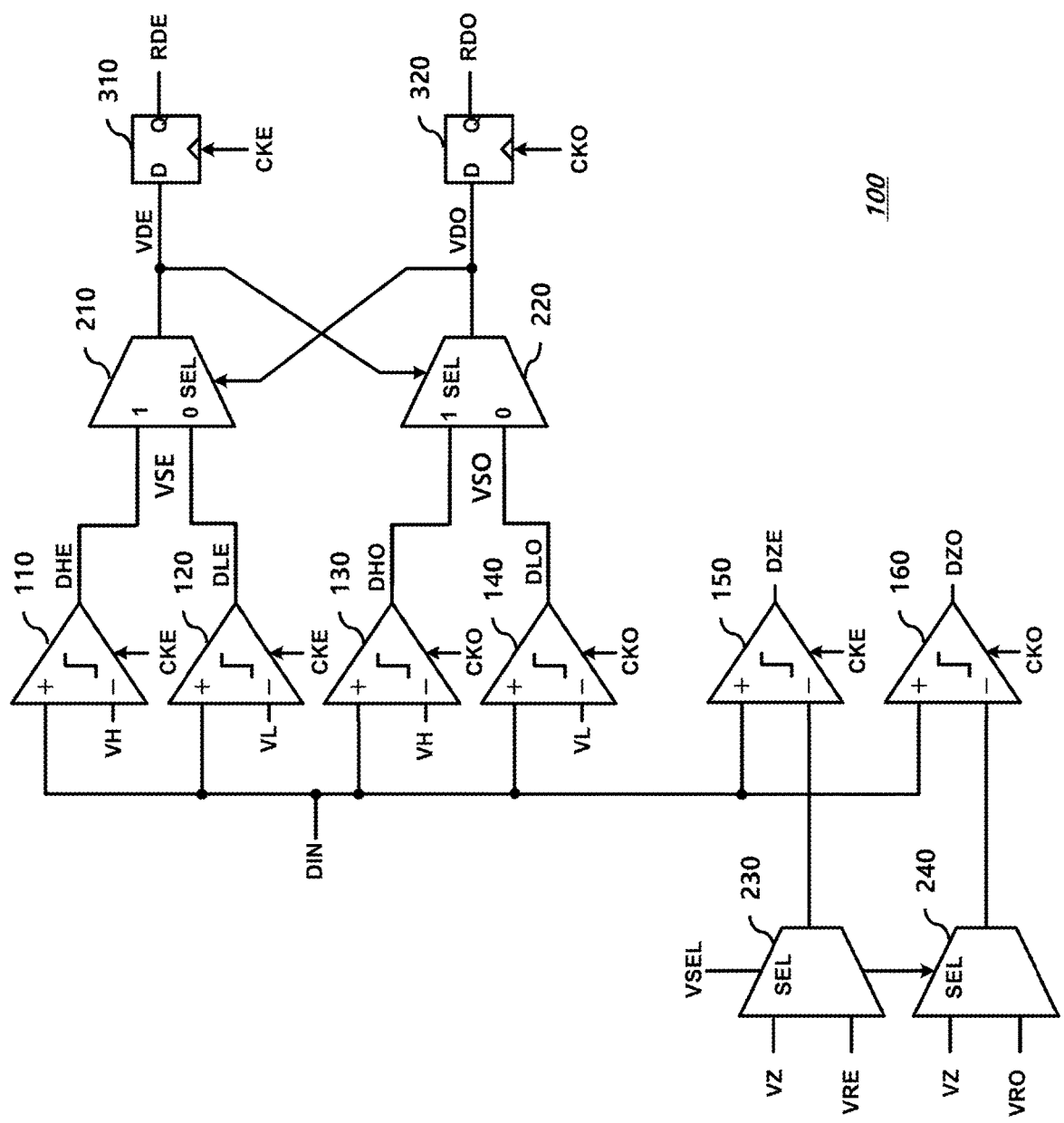
FIG. 8 illustrates a duobinary conversion circuit according to an embodiment of the present disclosure.

FIG. 8 is a block diagram showing the duobinary conversion circuit 100 of FIG. 1 according to an embodiment.

The duobinary conversion circuit 100 includes first to fourth comparators 110 to 140, a first selector 210, a second selector 220, a first flip-flop 310, and a second flip-flop 320.

The input signal DIN is a duobinary signal output from the analog receiver circuit 60 in FIG. 1 as described above.

Since the duobinary signal has three levels, the duobinary conversion circuit 100 may use the first reference voltage VH and the second reference voltage VL to distinguish the three levels.

The first reference voltage VH may be referred to as an upper reference voltage, and the second reference voltage VL may be referred to as a lower reference voltage.

The second reference voltage VL distinguishes between level 0 and level 1, and the first reference voltage VH distinguishes between level 1 and level 2.

The duobinary conversion circuit 100 uses an odd clock signal CKO and an even clock signal CKE.

For example, when the clock signal CLK is 10 GHz, both the even clock signal CKE and the odd clock signal CKO have a frequency of 5 GHz, so that an operation margin may be improved in converting a high-frequency signal.

The first comparator 110 outputs a comparison result (or a signal indicating the comparison result) DHE by comparing the input signal DIN and the first reference voltage VH in synchronization with the even clock signal CKE.

The first comparator 110 outputs the high level signal when the input signal DIN is greater than the first reference voltage VH and outputs the low level signal when the input signal DIN is smaller than the first reference voltage VH.

The second comparator 120 outputs a comparison result DLE by comparing the input signal DIN and the second reference voltage VL in synchronization with the even clock signal CKE.

The second comparator 120 outputs the high level signal when the input signal DIN is greater than the second reference voltage VL and outputs the low level signal when the input signal DIN is smaller than the second reference voltage VL.

Hereinafter, signals DHE and DLE respectively indicating the comparison results output from the first comparator 110 and the second comparator 120 are collectively referred to as a first comparison signal VSE.

The third comparator 130 outputs a comparison result DHO by comparing the input signal DIN and the first reference voltage VH in synchronization with the odd clock signal CKO.

The third comparator 130 outputs the high level signal when the input signal DIN is greater than the first reference voltage VH and outputs the low level signal when the input signal DIN is smaller than the first reference voltage VH.

The fourth comparator 140 outputs a comparison result DLO by comparing the input signal DIN and the second reference voltage VL in synchronization with the odd clock signal CKO.

The fourth comparator 140 outputs the high level signal when the input signal DIN is greater than the second reference voltage VL and outputs the low level signal when the input signal DIN is smaller than the second reference voltage VL.

Hereinafter, signals DHO and DLO respectively output from the third comparator 130 and the fourth comparator 140 are collectively referred to as a second comparison signal VSO.

The first comparator 110 and the third comparator 130 compare the input signal DIN with the first reference voltage VH, which determines whether the input signal DIN corresponds to level 1 or level 2.

The second comparator 120 and the fourth comparator 140 compare the input signal DIN with the second reference voltage VL, which determines whether the input signal DIN corresponds to level 0 or level 1.

When the currently determined NRZ data is 0 and the next NRZ data becomes 0 or 1, the duobinary signal has the level 0 or level 1.

Accordingly, when the currently determined NRZ data is 0, the second reference voltage VL is used to determine the next NRZ data.

Conversely, when the currently determined NRZ data is 1 and the next NRZ data becomes 0 or 1, the duobinary signal has level 1 or level 2.

Accordingly, when the currently determined NRZ data is 1, the first reference voltage VH is used to determine the next NRZ data.

The data to be determined next according to the currently determined data VDO based on the odd clock signal CKO is output from the first comparator 110 or the second comparator 120, so the output VDO of the second selector 220 is applied as a selection signal of the first selector 210.

That is, when the output VDO of the second selector 220 is at the high level, the first selector 210 selects the output of the first comparator 110, and when the output VDO is at the low level, the first selector 210 selects the output of the second comparator 120.

Conversely, the data to be determined next according to the currently determined data VDE based on the even clock signal CKE is output from the third comparator 130 or the fourth comparator 140, so the output VDE of the first selector 210 is applied as a selection signal of the second selector 220.

That is, when the output VDE of the first selector 210 is at the high level, the second selector 220 selects the output of the third comparator 130, and when the output VDE is at the low level, the second selector 220 selects the output of the fourth comparator 140.

The first flip-flop 310 latches the output of the first selector 210 according to the even clock signal CKE to output the even data signal RDE.

The second flip-flop 320 latches the output of the second selector 220 according to the odd clock signal CKO to output the odd data signal RDO.

The duobinary conversion circuit 100 may further include a fifth comparator 150, a sixth comparator 160, a third selector 230, and a fourth selector 240.

These may be used during the equalization operation of the control circuit 200.

The fifth comparator 150 outputs a comparison result DZE by comparing the input signal DIN and the output of the third selector 230 in synchronization with the even clock signal CKE.

The sixth comparator 160 outputs a comparison result DZO by comparing the input signal DIN and the output of the fourth selector 240 in synchronization with the odd clock signal CKO.

The third selector 230 selects and outputs the intermediate voltage VZ or the even reference voltage VRE according to the voltage selection signal VSEL.

The level of the even reference voltage VRE may be adjusted according to the control of the control circuit 200.

The fourth selector 240 selects and outputs the intermediate voltage VZ or the odd reference voltage VRO according to the voltage selection signal VSEL.

The level of the odd reference voltage VRO may be adjusted according to the control of the control circuit 200.

An equalization operation using the fifth comparator 150, the sixth comparator 160, the third selector 230, and the fourth selector 240 will be described in detail below.

Figure 9:
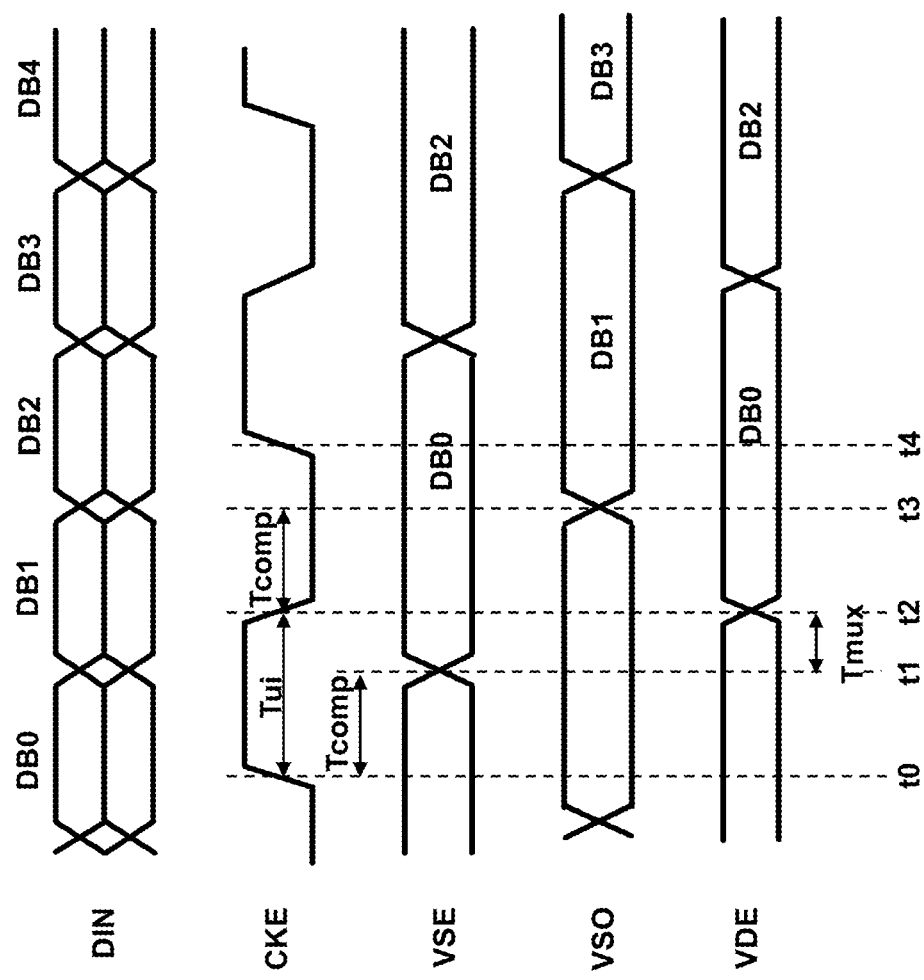
FIG. 9 is a timing diagram illustrating an operation of a duobinary conversion circuit according to an embodiment of the present disclosure.

FIG. 9 is a timing diagram illustrating an operation of the duobinary conversion circuit 100 according to an embodiment of the present disclosure.

As an input signal DIN, duobinary data DB0, DB1, DB2, DB3, and DB4 are sequentially input.

At t1 when a comparison time interval Tcomp elapses after the rising edge t0 of the even clock signal CKE, the first comparator 110 and the second comparator 120 output the comparison signal VSE corresponding to the duobinary data DB0. For example, the comparison time interval Tcomp may be a time interval from a zeroth time t0 at which the first comparator 110 and the second comparator 120 receive the rising edge of the even clock signal CKE and a first time t1 at which the first comparator 110 outputs a first comparison signal DHE and the second comparator 120 outputs a second comparison signal DLE.

After a selection time interval Tmux elapses from t1, the first selector 210 outputs a first selection signal VDE corresponding to the first comparison signal VSE. For example, the selection time interval Tmux is a time interval from the first time t1 at which the first selector 210 receives the first comparison signal DHE and the second comparison signal DLE to a second time t2 at which the first selector 210 outputs one of the first comparison signal DHE and the second comparison signal DLE as the first selection signal VDE.

In FIG. 9, the time at which the selection time interval Tmux elapses from t1 is shown to coincide with t2, but this is not necessarily the case.

In this case, the selection time interval Tmux includes a time at which the selection signal input to the first selector 210 is determined.

t2 corresponds to the falling edge of the even clock signal CKE, and corresponds to the rising edge of the odd clock signal CKO.

Accordingly, at t3 when a comparison time interval Tcomp elapses after the rising edge t2 of the odd clock signal CKO, the third comparator 130 and the fourth comparator 140 output the second comparison signal VSO according to the duobinary data DB1. For example, the comparison time interval Tcomp may be a time interval from the second time t2 at which the third comparator 130 and the fourth comparator 140 receive the rising edge of the odd clock signal CKO and a third time t3 at which the third comparator 130 outputs a third comparison signal DHO and the fourth comparator 140 outputs a fourth comparison signal DLO.

The first flip-flop 310 latches the first selection signal VDE at the next rising edge t4 of the even clock signal CKE and outputs the duobinary data DB0 as the first output signal RDE.

In order for the duobinary conversion circuit 100 of FIG. 8 to operate normally, the selection signal VDE input to the second selector 220, that is, the output signal of the first selector 210 may be determined in advance before the second signal VSO changes.

Accordingly, the following Equation 4 should be satisfied.

$$t0+Tcomp+Tmux<t2+Tcomp \quad \text{[Equation 4]}$$

Since t0 plus Tui equals to t2, the following Equation 5 is established.

$$Tmux<Tui \quad \text{[Equation 5]}$$

It can be seen from Equation 5 that it is sufficient if the selection time Tmux is less than Tui, Tui corresponding to half period of the even clock signal CKE or a single period of the clock signal CLK.

Through this, it can be seen that the operation margin of the duobinary conversion circuit 100 is sufficient. That is, the duobinary conversion circuit 100 may normally operate regardless of the comparison time interval Tcomp during which one or more comparators (e.g., the first and second comparators 110 and 120 in FIG. 8) each perform a comparison operation. The duobinary conversion circuit 100 according to an embodiment of the present disclosure may normally operate when the selection time interval Tmux is shorter than Tui, whereas the sum of the selection time interval Tmux and the comparison time interval Tcomp needs to be shorter than Tui in a conventional duobinary conversion circuit. Accordingly, even when a data transmission speed increases to make a unit interval (UI) relatively short, the duobinary conversion circuit 100 according to an embodiment may normally operate while ensuring sufficient operation margin for comparators thereof.

The second selector 220 selects any one of the second comparison signals VSO according to the first selection signal VDE output from the first selector 210 and outputs the second selection signal VDO.

The second flip-flop 320 samples the second selection signal VDO at the rising edge of the odd clock signal CKO and outputs a second output signal RDO.

The data serializer 80 in FIG. 1 may serialize the odd data signal RDO and the even data signal RDE by using the odd clock signal CKO and the even clock signal CKE.

As described above, the control circuit 200 performs an equalization operation and a reference voltage control operation, which will be described in detail below.

Figure 10A:
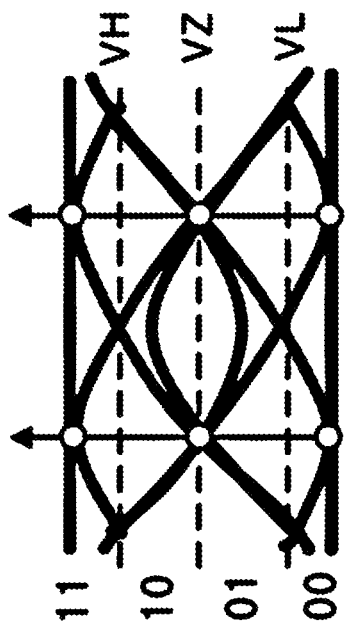
FIGS. 10A and 10B are eye diagrams before and after an equalization operation.
Figure 10B:
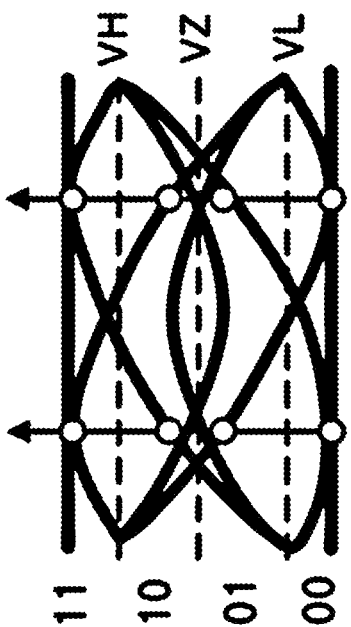

FIGS. 10A and 10B are eye diagrams before and after an equalization operation.

In an embodiment of the present disclosure, the equalization operation aims to increase the size of an eye on the eye diagram by substantially removing inter-symbol interference from a duobinary signal.

In this embodiment, in order to substantially remove inter-symbol interference, a post-cursor and a pre-cursor are substantially removed.

For example, removal of the post-cursor indicates that voltage of the level 1 is the same for both cases where the duobinary signal changes from level 0 to level 1 and from level 2 to level 1.

Also, removal of the pre-cursor indicates that when the duobinary signal changes from level 1 to level 0 or the duobinary signal changes from level 1 to level 2, the signals at start are at the same voltage.

In this embodiment, the completion of the equalization operation indicates that the voltage of the signal representing the level 1 becomes substantially constant at the intermediate voltage VZ.

FIG. 10A shows that the voltage of level 1 deviates from the intermediate voltage VZ before the equalization operation is completed.

FIG. 10B shows that the voltage of level 1 coincides with the intermediate voltage VZ after the equalization operation is completed.

FIGS. 11A and 11B are eye diagrams illustrating strength of an equalization operation.

FIG. 11A corresponds to a case where equalization is insufficient.

For example, it is assumed that the post-cursor has not been completely removed due to insufficient equalization.

Assuming a transition from level 2 at time (a) to level 1 at time (b), the voltage of level 1 sampled at time (b) is higher than the intermediate voltage VZ, and assuming a transition from level 0 at time (a) to level 1 at time (b), the voltage of level 1 sampled at time (b) is lower than the intermediate voltage VZ.

In order to compensate for this, it is desirable to increase the driving force of the post-tap driver 14 in FIG. 3.

Next, it is assumed that the pre-cursor is not completely removed due to insufficient equalization.

Assuming a transition from level 1 at time (a) to level 0 at time (b), the voltage of level 1 sampled at time (a) is lower than the intermediate voltage VZ, and assuming a transition from level 1 at time (a) to level 2 at time (b), the voltage of level 1 sampled at time (a) is higher than the intermediate voltage VZ.

In order to compensate for this, it is desirable to increase the driving force of the pre-tap driver 12.

FIG. 11B corresponds to a case where equalization is excessive.

For example, it is assumed that the post-cursor is removed more than necessary due to excessive equalization.

Assuming a transition from level 2 at time (c) to level 1 at time (d), the voltage of level 1 sampled at time (d) is lower than the intermediate voltage VZ, and assuming a transition from level 0 at time (c) to level 1 at time (d), the voltage of level 1 sampled at time (d) is higher than the intermediate voltage VZ.

In order to compensate for this, it is desirable to lower the driving force of the post-tap driver 14.

Next, it is assumed that the pre-cursor is removed more than necessary due to excessive equalization.

Assuming a transition from level 1 at time (c) to level 0 at time (d), the voltage of level 1 sampled at time (c) is higher than the intermediate voltage VZ, and assuming a transition from level 1 at time (c) to level 2 at time (d), the voltage of level 1 sampled at time (c) is lower than the intermediate voltage VZ.

In order to compensate for this, it is desirable to lower the driving force of the pre-tap driver 12.

When voltage of level 1 is higher than the intermediate voltage VZ, it corresponds to state "10," and when voltage of level 1 is lower than the intermediate voltage VZ, it corresponds to state "01."

FIG. 12 is a table showing a method of controlling driving force of the pre-tap driver 12 and the post-tap driver 14 during the equalization operation according to an embodiment.

"Up" indicates increasing driving force, which indicates increasing the pre-control signal ECPR or the post-control signal ECPO.

For example, when the previous state is "00" and the current state is "01," the post-control signal ECPO is increased to increase the driving force of the post-tap driver 14.

"Down" indicates reducing driving force, which indicates decreasing the pre-control signal ECPR or the post-control signal ECPO.

For example, when the previous state is "10" and the current state is "00," the pre-control signal ECPR is reduced to reduce driving force of the pre-tap driver 12.

Figure 13:
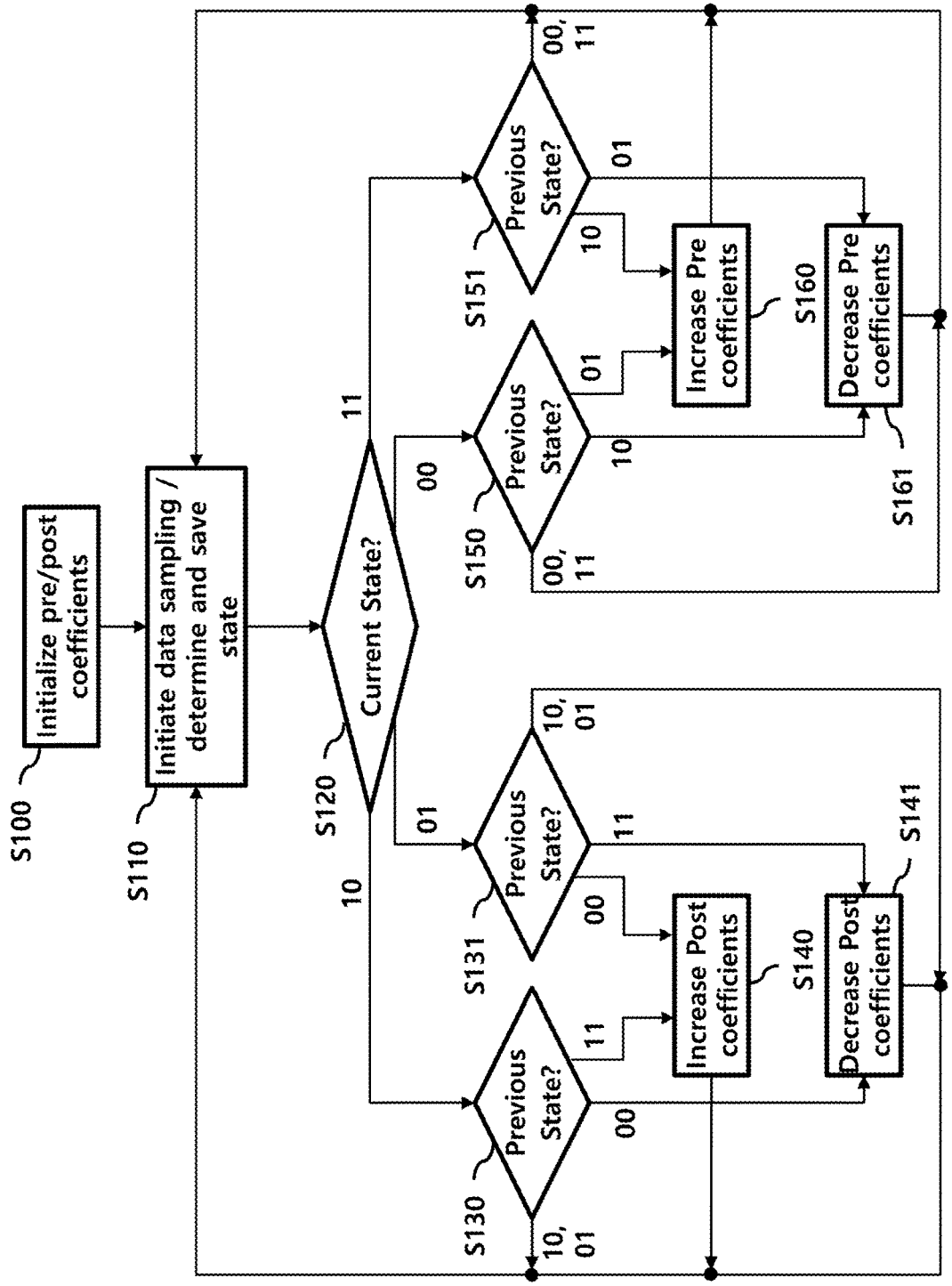
FIG. 13 is a flow chart illustrating an equalization operation according to an embodiment of the present disclosure.

FIG. 13 is a flowchart illustrating an equalization operation according to an embodiment of the present disclosure.

First, the pre-coefficient and post-coefficient are initialized at step S100.

At this time, the pre-coefficient corresponds to the pre-control signal ECPR and the post-coefficient corresponds to the post-control signal ECPO. For example, the pre-coefficient may be equal to or proportional to a value of the pre-control signal ECPR, and the post-coefficient may be equal to or proportional to a value of the post-control signal ECPO.

Thereafter, data sampling is started to determine and store a state at step S110.

At this time, both the current state and the previous state are stored.

For example, the current state may be determined based on the outputs DHE and DLE of the first comparator 110 and the second comparator 120 synchronized with the even clock signal CKE.

At this time, the previous state may be determined based on the outputs DHO and DLO of the third comparator 130 and the fourth comparator 140 synchronized with the odd clock signal CKO.

In this case, the outputs DZE and DZO of the fifth comparator 150 and the sixth comparator 160 may be additionally used to distinguish between the two states "01" and "10" corresponding to the level 1.

At this time, the control circuit 200 controls both the third selector 230 and the fourth selector 240 to select the intermediate voltage VZ.

For example, when the current state is determined to be level 1 using the outputs DHE and DLE of the first comparator 110 and the second comparator 120, the level 1 is determined as a higher level 1 where the input signal DIN is higher than the intermediate voltage VZ if the output DZE of the fifth comparator 150 is at the high level, and the level 1 is determined as a lower level 1 where the input signal DIN is lower than the intermediate voltage VZ if the output DZE of the fifth comparator 150 is at the low level.

Hereinafter, the higher level 1 may be indicated as a level 1H, and the lower level 1 may be indicated as a level 1L.

Also, the level 1H corresponds to state "10" and the level 1L corresponds to state "01."

After that, the current state is determined at step S120.

As disclosed in the table of FIG. 12, adjustment of the post-coefficient is performed when the current state is "01" or "10," and adjustment of the pre-coefficient is performed when the current state is "00" or "11."

If the current state is "10," the process proceeds to step S130, and if the current state is "01," the process proceeds to step S131, thereby adjusting the post coefficient.

At step S130, the previous state is determined.

If the previous state is "10" or "01," the pre-coefficient is not adjusted, and thus the process returns to step S110.

If the previous state is "11," since the equalization operation is insufficient, the post-coefficient is increased at step S140. After that, it returns to step S110.

If the previous state is "00," since the equalization operation is excessive, the post-coefficient is decreased at step S141. After that, it returns to step S110.

At step S131, the previous state is determined.

If the previous state is "10" or "01," the post-coefficient is not adjusted, and thus the process returns to step S110.

If the previous state is "00," since the equalization operation is insufficient, the post-coefficient is increased at step S140. After that, it returns to step S110.

If the previous state is "11," since the equalization operation is excessive, the post-coefficient is decreased at step S141. After that, it returns to step S110.

If the current state is "00," the process proceeds to step S150, and if the current state is "11," the process proceeds to step S151, thereby adjusting the pre-coefficient.

At step S150, the previous state is determined.

If the previous state is "00" and "11," the pre-coefficient is not adjusted, and thus the process returns to step S110.

If the previous state is "01," since the equalization operation is insufficient, the pre-coefficient is increased at step S160. After that, it returns to step S110.

If the previous state is "10," since the equalization operation is excessive, the pre-coefficient is decreased at step S161. After that, it returns to step S110.

At step S151, the previous state is determined.

If the previous state is "00" or "11," the pre-coefficient is not adjusted and the process returns to step S110.

If the previous state is "10," since the equalization operation is insufficient, the pre-coefficient is increased at step S160. After that, it returns to step S110.

If the previous state is "01," since the equalization operation is excessive, the pre-coefficient is decreased at step S161. After that, it returns to step S110.

Figure 14:
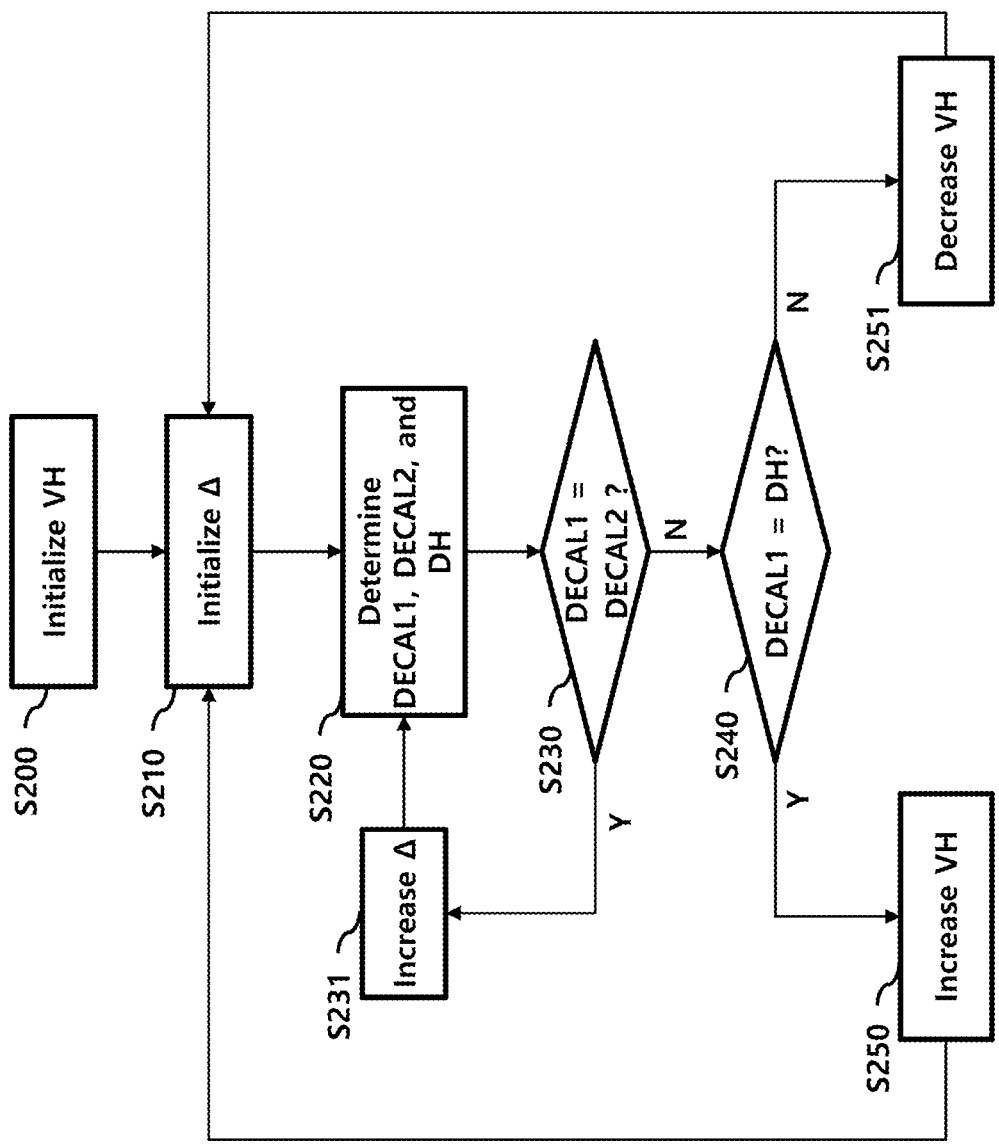
FIG. 14 is a flow chart illustrating an operation to adjust a reference voltage according to an embodiment of the present disclosure.

FIG. 14 is a flowchart illustrating a reference voltage adjustment operation according to an embodiment of the present disclosure.

As described above with reference to FIG. 13, the control circuit 200 in FIG. 1 expands size of the eye by performing an equalization operation.

The control circuit 200 performs a reference voltage adjustment operation such that the first reference voltage VH and the second reference voltage VL are located in the middle of the eye.

The reference voltage adjustment operation may be performed in parallel with the equalization operation.

In this embodiment, after performing steps S140, S141, S160, and S161 in FIG. 13, a reference voltage adjustment operation is performed.

Timing at which the reference voltage adjustment operation is performed during the equalization operation may vary according to embodiments.

For example, in another embodiment, the reference voltage adjustment operation may be performed after adjusting the pre-coefficient or the post-coefficient are performed after a predetermined number of times.

FIG. 14 shows an operation of adjusting the first reference voltage VH.

First, the first reference voltage VH is initialized at step S200.

Next, the variable (or a variable deviation) $\Delta$ is initialized at step S210.

Next, the reference voltage is adjusted and results DECAL1, DECAL2, and DH obtained by comparing the reference voltage with the input signal DIN are stored at step S220.

DECAL1 corresponds to a first result of comparison where the reference voltage compared with the input signal DIN is set as a first adjustment voltage VH+$\Delta$.

DECAL2 corresponds to a second result of comparison where the reference voltage compared with the input signal DIN is set as a second adjustment voltage VH−$\Delta$.

DH corresponds to a third result of comparison where the reference voltage compared with the input signal DIN is set as voltage VH.

The control circuit 200 may determine DECAL1, DECAL2, and DH from the outputs DZE and DZO of the fifth and sixth comparators 150 and 160 in FIG. 8.

To this end, the control circuit 200 may control the third selector 230 and the fourth selector 240 in FIG. 8 to output a reference voltage of a corresponding level.

Also, the control circuit 200 may control the odd reference voltage VRO and the even reference voltage VRE to be a first adjustment voltage VH+$\Delta$ or a second adjustment voltage VH−$\Delta$.

Thereafter, it is determined whether the values of DECAL1 and DECAL2 are the same at step S230.

When the two values are the same, it indicates that both the first adjustment voltage VH+$\Delta$ and the second adjustment voltage VH−$\Delta$ exist inside the eye.

If the two values are the same, the variable $\Delta$ is increased and the process proceeds to step S220.

Figure 15:
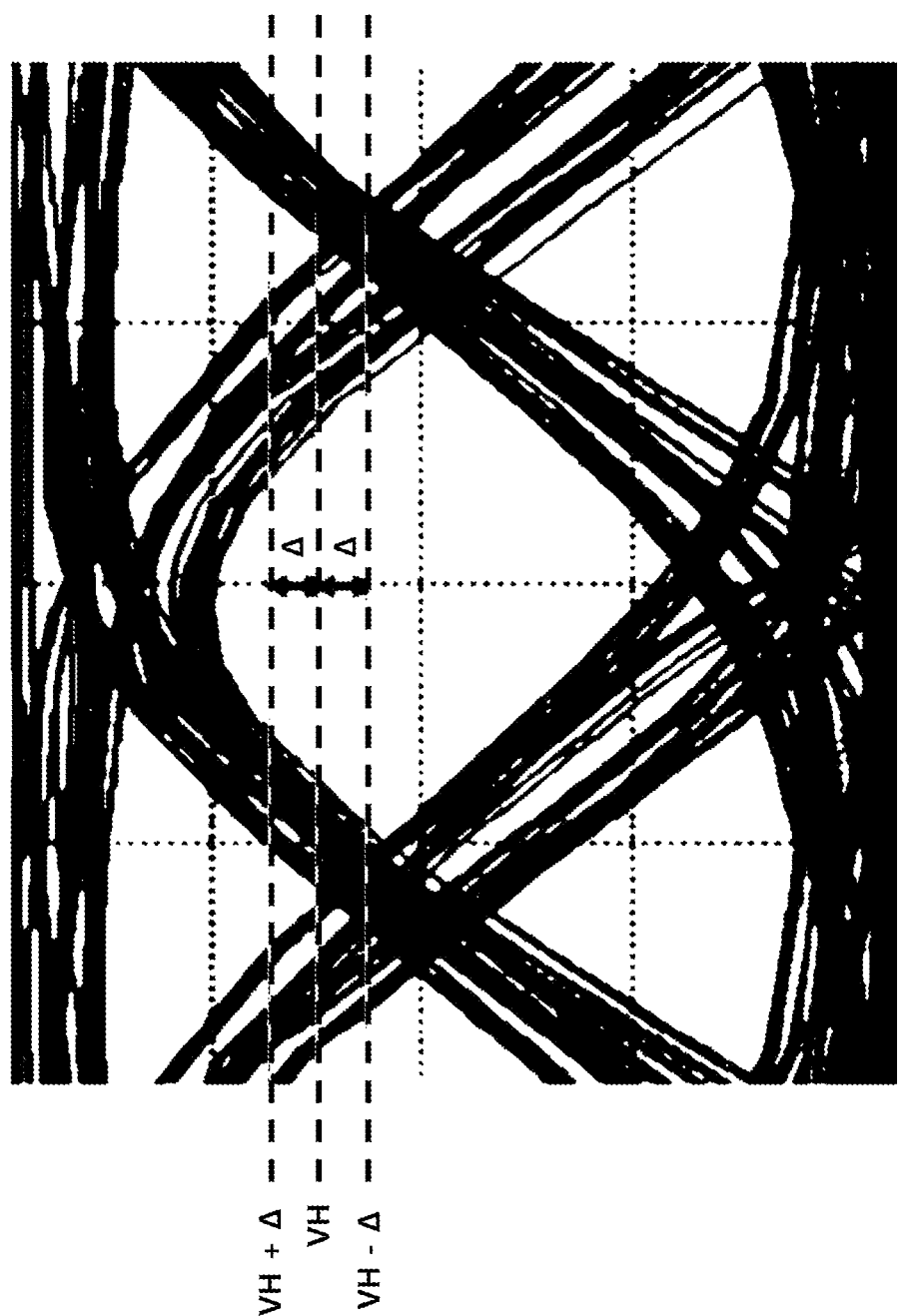
FIGS. 15, 16, and 17 are graphs illustrating an operation to adjust a reference voltage according to an embodiment of the present disclosure.
Figure 16:
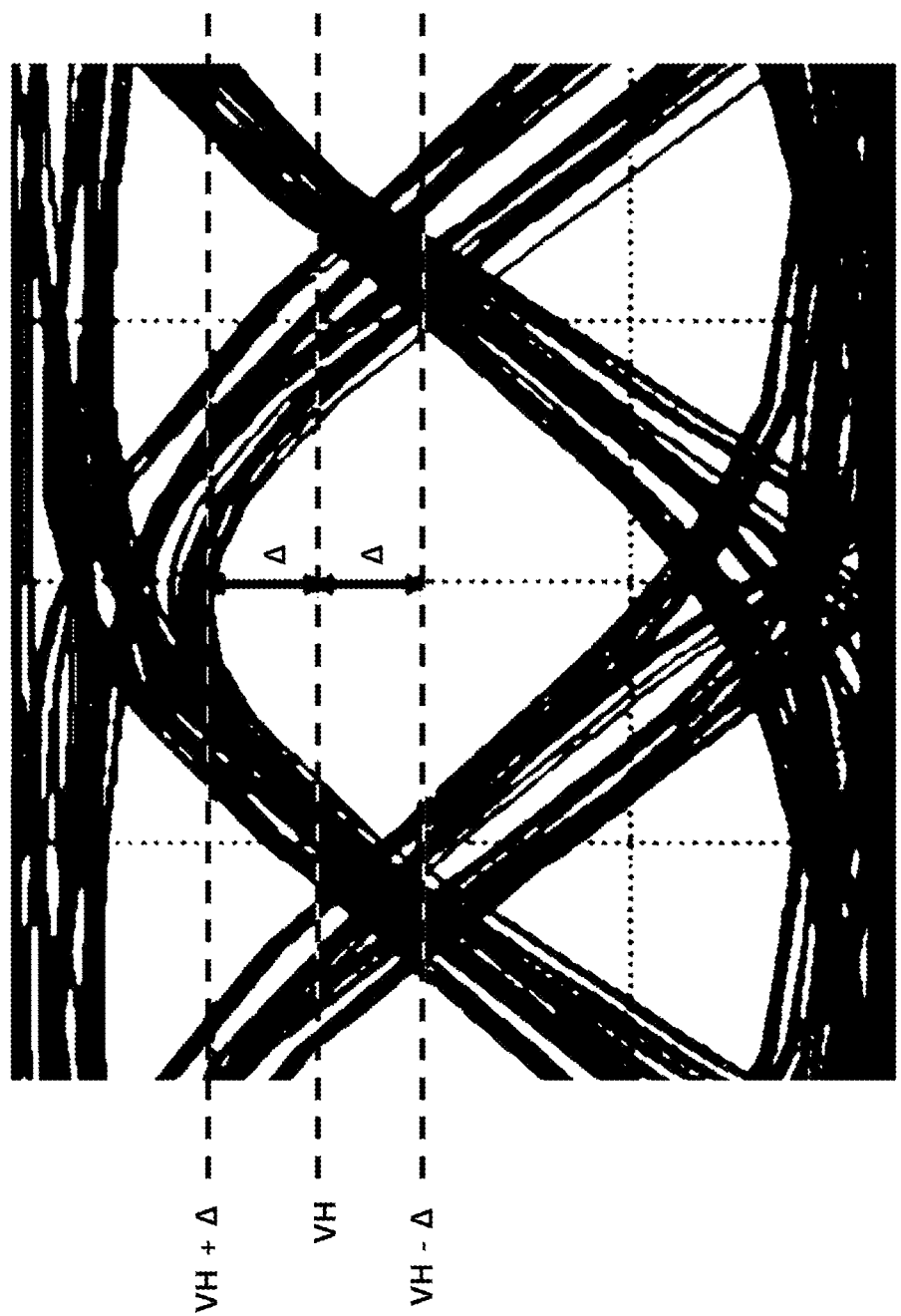

FIG. 15 is an eye diagram showing a first reference voltage VH, a first adjustment voltage VH+$\lambda$, and a second adjustment voltage VH−$\Delta$ before increasing the variable $\Delta$, and FIG. 16 is an eye diagram showing a first reference voltage VH, a first adjustment voltage VH+$\Delta$, and a second adjustment voltage VH−$\Delta$ after increasing the variable $\Delta$.

If the values of DECAL1 and DECAL2 are different, it indicates that the first adjustment voltage VH+$\Delta$ or the second adjustment voltage VH−$\Delta$ has reached the boundary of the eye.

When the first adjustment voltage VH+$\Delta$ reaches the boundary, the first adjustment voltage VH+$\Delta$ reaches the upper limit of the eye, and when the second adjustment voltage VH−$\Delta$ reaches the boundary, the second adjustment voltage VH−$\Delta$ reaches the lower limit of the eye.

Thereafter, it is determined whether the values of DECAL1 and DH are the same at step S240.

If the values of DECAL1 and DH are the same, it indicates that the second adjustment voltage VH−$\Delta$ reaches the boundary. That is, this comparison result indicates that the first reference voltage VH is lower than a target level.

Accordingly, after increasing the first reference voltage VH by a predetermined width at step S250, the process proceeds to step S210.

If the values of DECAL1 and DH are not the same, it indicates that the first adjustment voltage VH+$\Delta$ reaches the boundary. That is, this comparison result indicates that the first reference voltage VH is higher than a target level.

Accordingly, after reducing the first reference voltage VH by a predetermined width at step S251, the process proceeds to step S210.

FIG. 16 shows an eye diagram where the first adjustment voltage VH+$\Delta$ reaches the upper limit of the eye.

Figure 17:
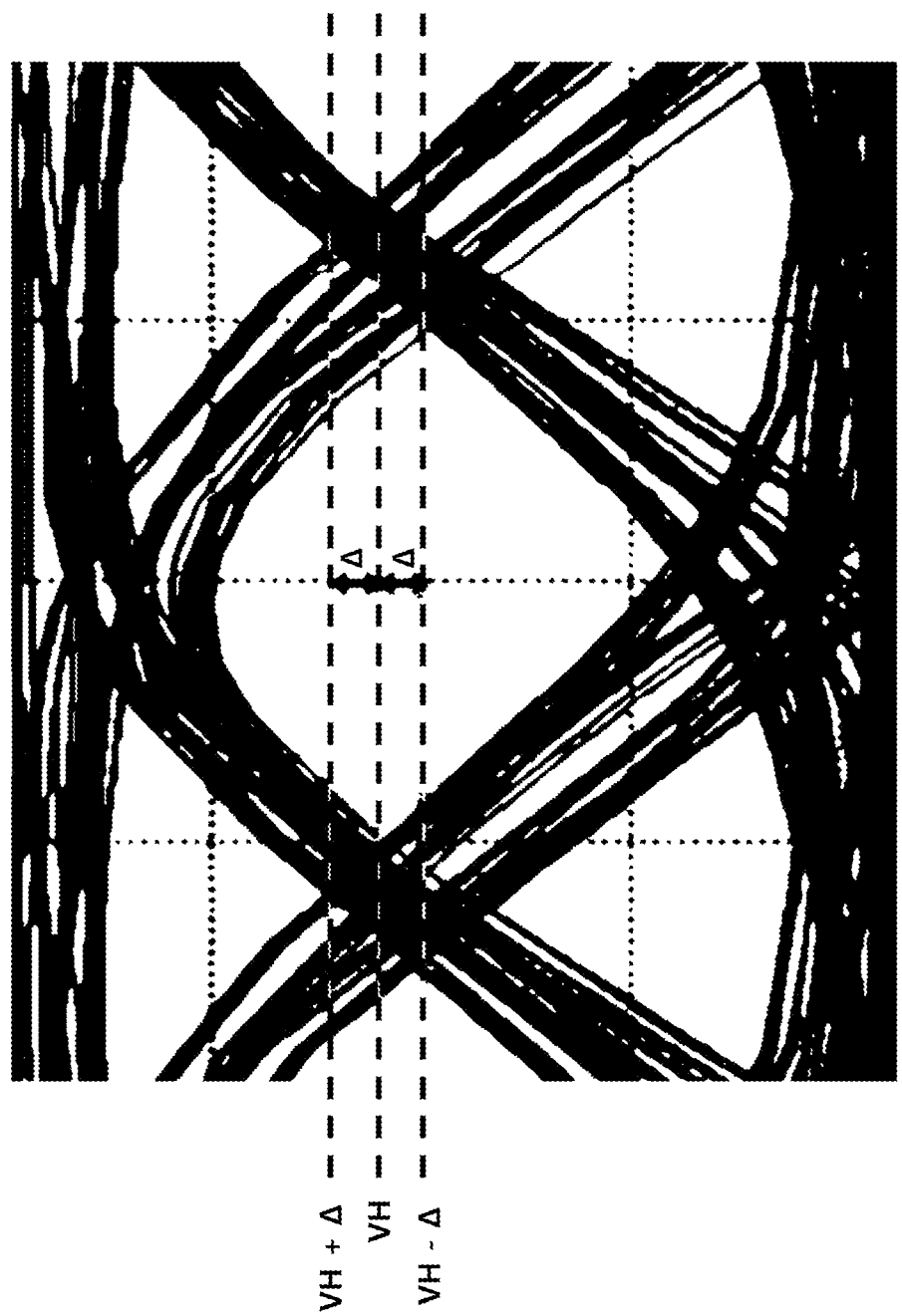

FIG. 17 shows an eye diagram after lowering the level of the first reference voltage VH and initializing the variable $\Delta$.

Since an operation of adjusting the second reference voltage VL can be derived from the above descriptions regarding the operation of adjusting the first reference voltage VH, detailed descriptions thereof will be omitted for the interest of brevity. According to an embodiment of the present disclosure, the first reference voltage VH and the second reference voltage VL may be adjusted when a DC level of the input signal DIN changes during the equalization operation, thereby ensuring a reliable operation of a transceiver (e.g., the transceiver of FIG. 1).

In addition, although the above-described embodiments use a differential circuit as an example, embodiment of the present disclosure can use a circuit having a single ended circuit.

Although various embodiments have been illustrated and described, various changes and modifications may be made to the described embodiments without departing from the spirit and scope of the invention as defined by the following claims.

What is claimed is:

1. A transceiver comprising:
    a duobinary conversion circuit configured to determine a level of an input signal according to an intermediate voltage, a first reference voltage higher than the intermediate voltage, and a second reference voltage lower than the intermediate voltage, wherein the input signal is a duobinary signal, and to convert the input signal into a non-return-to-zero (NRZ) signal;
    a control circuit configured to generate one or more control signals to remove inter-symbol interference (ISI) between symbols of the input signal, and to adjust the first reference voltage, or the second reference voltage, or both according to the level of the input signal; and an analog receiver circuit configured to output the duobinary signal to the duobinary conversion circuit.

2. The transceiver of claim 1,
wherein the control circuit generates a pre-control signal for controlling a pre-cursor, or a post-control signal for controlling a post-cursor, or both as the control signals.

3. The transceiver of claim 2, wherein the input signal has a first level, a second level, and a third level, the second level being higher than the first level, the third level higher than the second level, and
wherein the control circuit adjusts the post-control signal according to a previous value of the input signal and a result of comparing a current value of the input signal with the intermediate voltage, when the current value of the input signal corresponds to the second level.

4. The transceiver of claim 2, wherein the input signal has a first level, a second level, and a third level, the second level being higher than the first level, the third level higher than the second level, and
wherein the control circuit adjusts the pre-control signal according to a current value of the input signal and a result of comparing a previous value of the input signal with the intermediate voltage, when the previous value of the input signal corresponds to the second level.

5. The transceiver of claim 2, wherein the control circuit adjusts the first reference voltage, or the second reference voltage, or both after adjusting the post-control signal, or the pre-control signal, or both.

6. The transceiver of claim 5, wherein the control circuit sets a first adjustment voltage by summing the first reference voltage and a variable deviation and a second adjustment voltage by subtracting the variable deviation from the first reference voltage, and adjusts the variable deviation or the first reference voltage according to a first comparison result of the first adjustment voltage with the input signal, a second comparison result of the second adjustment voltage with the input signal, and a third comparison result of the first reference voltage with the input signal.

7. The transceiver of claim 1, wherein the duobinary conversion circuit comprises:
a first comparator configured to compare the input signal with the first reference voltage in synchronization with an even clock signal to generate a first comparison signal;
a second comparator configured to compare the input signal with the second reference voltage in synchronization with the even clock signal to generate a second comparison signal;
a third comparator configured to compare the input signal with the first reference voltage in synchronization with an odd clock signal to generate a third comparison signal;
a fourth comparator configured to compare the input signal with the second reference voltage in synchronization with the odd clock signal to generate a fourth comparison signal;
a first selector configured to select the first comparison signal or the second comparison signal to generate a first selection signal;
a second selector configured to select the third comparison signal or the fourth comparison signal according to the first selection signal to generate a second selection signal;
a first flip-flop configured to latch a first output of the first selector according to the even clock signal; and
a second flip-flop configured to latch a second output of the second selector according to the odd clock signal,
wherein the first selector is further configured to select the first comparison signal or the second comparison signal according to the second selection signal.

8. The transceiver of claim 7, wherein the duobinary conversion circuit further comprises:
a fifth comparator configured to compare the input signal with the intermediate voltage or an even reference voltage in synchronization with the even clock signal; and
a sixth comparator configured to the input signal with the intermediate voltage or an odd reference voltage in synchronization with the odd clock signal.

9. The transceiver of claim 8, further comprising:
a third selector configured to provide the intermediate voltage or the even reference voltage to the fifth comparator as a third output; and
a fourth selector configured to provide the intermediate voltage or the odd reference voltage to the sixth comparator as a fourth output,
wherein the fifth comparator compares the input signal with the third output of the third selector and the sixth comparator compares the input signal with the fourth output of the fourth selector.

10. The transceiver of claim 1, further comprising a duobinary driver configured to drive a data channel coupled to an output node thereof according to parallel data and the control signals.

11. The transceiver of claim 10, wherein the duobinary driver comprises:
a pre-driver configured to generate parallel operation data according to the parallel data and multi-phase clock signals;
a first delay circuit configured to delay the parallel operation data to generate first delayed operation data;
a second delay circuit configured to delay the first delayed operation data to generate second delayed operation data;
a pre-tap driver configured to drive the output node according to the parallel operation data and a pre-control signal among the control signals;
a main-tap driver configured to drive the output node according to the first delayed operation data and a main-control signal among the control signals; and
a post-tap driver configured to drive the output node according to the second delayed operation data and a post-control signal among the control signals.

12. The transceiver of claim 11, wherein the multi-phase clock signals are four-phase clock signals and the parallel operation data includes first data, second data, third data, and fourth data each synchronized with a corresponding one of the four-phase clock signals.

13. The transceiver of claim 12, wherein the main-tap driver includes:
a first resistor coupled between a power source and a first node;
a second resistor coupled between the power source and a second node;
a first switch coupling the first node with a third node according to the first data;
a second switch coupling the second node with the third node according to an inverted version of the first data;
a third switch coupling the first node with a fourth node according to the second data;
a fourth switch coupling the second node with the fourth node according to an inverted version of the second data;

a fifth switch coupling the first node with the third node according to the third data;
a sixth switch coupling the second node with the third node according to an inverted version of the third data;
a seventh switch coupling the first node with the fourth node according to the fourth data;
an eighth switch coupling the second node with the fourth node according to an inverted version of the fourth data;
a first current source coupled to the third node and controlling a first driving current according to the main-control signal; and
a second current source coupled to the fourth node and controlling a second driving current according to the main-control signal,
wherein the output node is coupled to the second node.

14. A method of operating a transceiver, the transceiver including an analog receiver circuit and a duobinary conversion circuit, the duobinary conversion circuit configured to determine a level of an input signal according to an intermediate voltage, a first reference voltage higher than the intermediate voltage, and a second reference voltage lower than the intermediate voltage, wherein the input signal is a duobinary signal, and to convert the input signal into a non-return-to-zero (NRZ) signal, the method comprising:
outputting the duobinary signal, by the analog receiver circuit, to the duobinary conversion circuit;
generating one or more control signals to remove inter-symbol interference (ISI) in the input signal according to the level of the input signal; and
adjusting the first reference voltage, or the second reference voltage, or both, according to the level of the input signal.

15. The method of claim 14, wherein the input signal has a first level, a second level, and a third level, the second level being higher than the first level, the third level higher than the second level, and
wherein generating the control signals includes:
determining a current value and a previous value of the input signal by comparing the input signal with the intermediate voltage, the first reference voltage, and the second reference voltage;
adjusting a post-control signal when the current value corresponds to the second level and the previous value corresponds to the first level or the third level; and
adjusting a pre-control signal when the current value corresponds to the first level or the third level and the previous value corresponds to the second level.

16. The method of claim 15, wherein the second level is determined as a higher level when the level of the input signal corresponds to the second level and the input signal is greater than the intermediate voltage, and the second level is determined as a lower level when the level of the input signal corresponds to the second level and the input signal is smaller than the intermediate voltage.

17. The method of claim 16, wherein adjusting the post-control signal includes:
increasing the post-control signal when the current value corresponds to the higher level and the previous value corresponds to the third level and decreasing the post-control signal when the current value corresponds to the higher level and the previous value corresponds to the first level; and
increasing the post-control signal when the current value corresponds to the lower level and the previous value corresponds to the first level and decreasing the post-control signal when the current value corresponds to the lower level and the previous value corresponds to the third level.

18. The method of claim 16, wherein adjusting the pre-control signal includes:
increasing the pre-control signal when the current value corresponds to the first level and the previous value corresponds to the lower level and decreasing the pre-control signal when the current value corresponds to the first level and the previous value corresponds to the higher level; and
increasing the pre-control signal when the current value corresponds to the third level and the previous value corresponds to the higher level and decreasing the pre-control signal when the current value corresponds to the third level and the previous value corresponds to the lower level.

19. The method of claim 14, wherein adjusting the first reference voltage includes:
initializing a variable deviation of the first reference voltage;
determining a first comparison result of the input signal with a first adjustment voltage, the first adjustment voltage being obtained by summing the first reference voltage and the variable deviation;
determining a second comparison result of the input signal with a second adjustment voltage, the second adjustment voltage being obtained by subtracting the variable deviation from the first reference voltage;
determining a third comparison result of the input signal with the first reference voltage; and
adjusting the first reference voltage according to the first comparison result, the second comparison result, and the third comparison result.

20. The method of claim 19, wherein adjusting the first reference voltage further includes:
adjusting the variable deviation when the first comparison results is the same as the second comparison result; and
adjusting the first reference voltage when the first comparison result is different from the second comparison result.

* * * * *